United States Patent
Wu et al.

(10) Patent No.: US 9,576,814 B2
(45) Date of Patent: *Feb. 21, 2017

(54) METHOD OF SPACER PATTERNING TO FORM A TARGET INTEGRATED CIRCUIT PATTERN

(71) Applicant: Taiwan Semiconductor Manufacturing Company, Ltd., Hsin-Chu (TW)

(72) Inventors: Chieh-Han Wu, Kaohsiung (TW); Cheng-Hsiung Tsai, Miaoli County (TW); Chung-Ju Lee, Hsinchu (TW); Ming-Feng Shieh, Tainan County (TW); Ru-Gun Liu, Hsinchu County (TW); Shau-Lin Shue, Hsinchu (TW); Tien-I Bao, Taoyuan County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/853,857

(22) Filed: Sep. 14, 2015

(65) Prior Publication Data
US 2016/0005617 A1    Jan. 7, 2016

Related U.S. Application Data

(63) Continuation of application No. 14/134,027, filed on Dec. 19, 2013, now Pat. No. 9,136,106.

(51) Int. Cl.
*H01L 21/308* (2006.01)
*H01L 21/02* (2006.01)
(Continued)

(52) U.S. Cl.
CPC ...... *H01L 21/3086* (2013.01); *H01L 21/0274* (2013.01); *H01L 21/02104* (2013.01); *H01L 21/0337* (2013.01); *H01L 21/308* (2013.01); *H01L 21/30604* (2013.01); *H01L 21/31116* (2013.01); *H01L 21/76802* (2013.01)

(58) Field of Classification Search
None
See application file for complete search history.

(56) References Cited

U.S. PATENT DOCUMENTS 7,291,560 B2 * 11/2007 Parascandola ...... H01L 21/0337
216/41
8,012,674 B2 * 9/2011 Fischer ............... H01L 21/0338
430/314

(Continued)

*Primary Examiner* — Bilkis Jahan
(74) *Attorney, Agent, or Firm* — Haynes and Boone, LLP

(57) ABSTRACT

A method of forming a target pattern includes forming a plurality of lines over a substrate with a first mask and forming a first spacer layer over the substrate, over the plurality of lines, and onto sidewalls of the plurality of lines. The plurality of lines is removed, thereby providing a patterned first spacer layer over the substrate. The method further includes forming a second spacer layer over the substrate, over the patterned first spacer layer, and onto sidewalls of the patterned first spacer layer, and forming a patterned material layer over the second spacer layer with a second mask. Whereby, the patterned material layer and the second spacer layer collectively define a plurality of trenches.

20 Claims, 19 Drawing Sheets

(51) Int. Cl.
*H01L 21/033* (2006.01)
*H01L 21/027* (2006.01)
*H01L 21/306* (2006.01)
*H01L 21/311* (2006.01)
*H01L 21/768* (2006.01)

(56) References Cited

U.S. PATENT DOCUMENTS

| | | |
|---|---|---|
| 8,273,634 B2 | 9/2012 | Sills et al. |
| 8,835,321 B2 | 9/2014 | Ha |
| 2010/0144150 A1* | 6/2010 | Sills .................... H01L 21/0273 438/694 |
| 2012/0208361 A1* | 8/2012 | Ha ...................... H01L 21/0337 438/597 |

* cited by examiner

METHOD OF SPACER PATTERNING TO FORM A TARGET INTEGRATED CIRCUIT PATTERN

PRIORITY DATA

The present application is a continuation patent application of U.S. patent application Ser. No. 14/134,027, filed on Dec. 19, 2013, now U.S. Pat. No. 9,136,106, the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
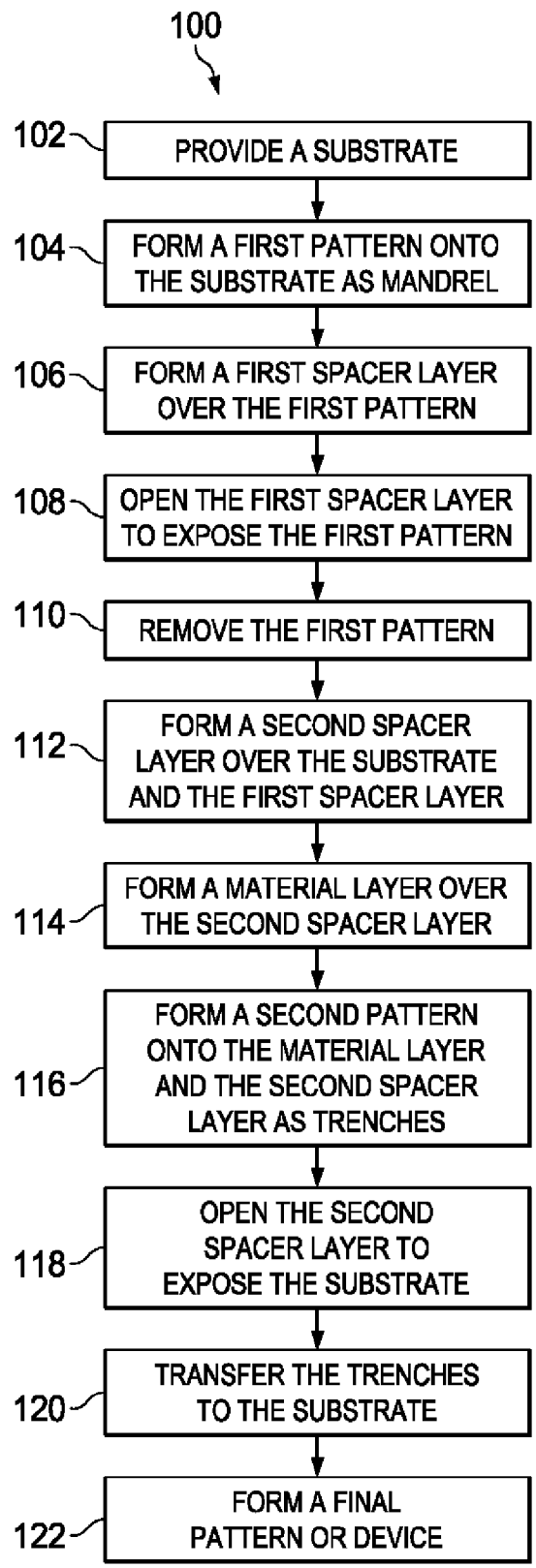
FIG. 1 is a flow chart of a method of forming a target pattern or device on a substrate for implementing one or more embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is generally related to using spacer techniques to improve integrated circuit pattern density in advanced process nodes, such as 14 nanometer (nm), 10 nm, and so on, with 193 nm immersion lithography or other suitable lithographic technologies. In one spacer technique, a photoresist material is patterned on a substrate and is subsequently trimmed. Then, the trimmed photoresist pattern is transferred to a mandrel layer below thereby forming mandrel lines and the trimmed photoresist pattern is thereafter removed. A spacer is formed on the sidewalls of the mandrel lines. A subsequent spacer etching and mandrel removing process results in leaving the spacer on the substrate as a final pattern. While the pitch of the final pattern is reduced attributable to the photoresist trimming process, a line end-to-end (EtE) distance of the final pattern is undesirably increased by the same photoresist trimming process. This can be explained by nearly equal etching rates of the photoresist material at both the lateral and vertical directions. The present disclosure uses a double spacer process to increase a final pattern density even without the photoresist trimming process. An advantage of the present disclosure is that the final pattern's pitch, line-to-line spacing and EtE distance can be flexibly tuned by adjusting thickness of the spacers.

Referring now to FIG. 1, a flow chart of a method 100 for forming a target pattern or device according to various aspects of the present disclosure is illustrated. Additional operations can be provided before, during, and after the method 100, and some operations described can be replaced, eliminated, or moved around for additional embodiments of the method. The method 100 will be further described below.

The method 100 is an example, and is not intended to limit the present disclosure beyond what is explicitly recited in the claims.

Figure 2:
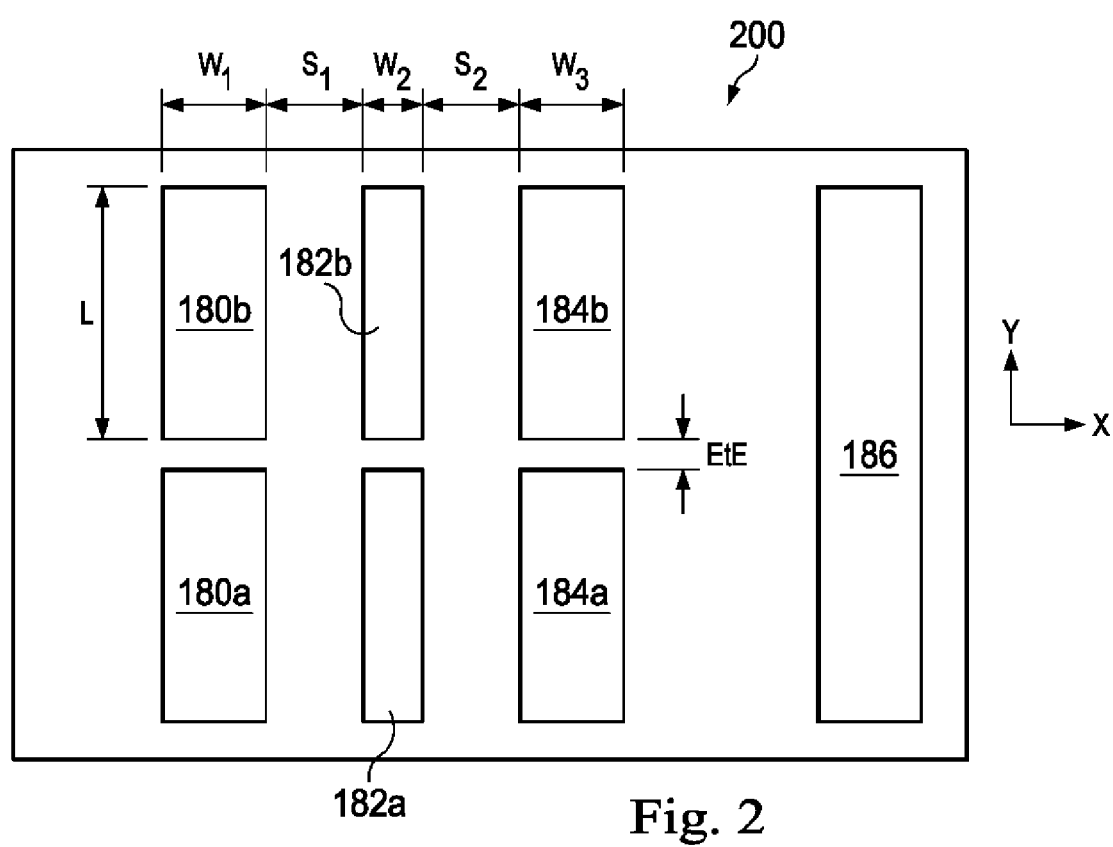
FIG. 2 illustrates an exemplary substrate and a target pattern to be formed thereon according to various aspects of the present disclosure.

FIG. 2 shows an exemplary target pattern 200. The target pattern 200 includes dense features 180a-b, 182a-b, and 184a-b, arranged in two rows, and an isolated feature 186. For the sake of example, the "b" features (180b, 182b, and 184b) have the same dimensions and spacing as the "a" features (180a, 182a, and 184a) respectively and all the "a" and "b" features have the same dimension L in Y direction. An end to end distance in Y direction between the "b" features and the "a" features, EtE, is a critical dimension of the target pattern 200. The features 180a, 182a, and 184a have a width $W_1$, $W_2$, and $W_3$ respectively in X direction. Furthermore, the features 180a, 182a, and 184a are spaced by spacing $S_1$ and $S_2$ in X direction. The target pattern 200 may be used to form various features of an integrated circuit (IC). In an embodiment, the target pattern 200 is used to form metal lines in a multilayer interconnection structure. In another embodiment, the target pattern 200 is used to form a plurality of trenches in the semiconductor substrate for shallow trench isolation (STI) features. As the density of integrated circuits increases, some features may be too close together for the resolution of a mask (or photo mask). To overcome this issue, features of a target pattern can be assigned to two or more masks. In the present embodiment, the features 180a-b and 184a-b are assigned to a first mask and the features 182a-b and 186 are assigned to a second mask. As will be discussed below, the second mask includes patterns overlapping the features 180a-b and 184a-b with relaxed precisions, using a spacer self-aligning technique. This point will be detailed in a later section.

In the following discussion, the method 100 (FIG. 1) is described in conjunction with FIGS. 3a-17b to show how the target pattern 200 is formed using the first mask and the second mask according to various aspects of the present disclosure. In each of the FIGS. 3a-18b, the figure designated with the suffix "a" (e.g., FIG. 3a) includes a dotted line that defines cross sectional views for the figures designated with the suffix "b," "c," and so on (e.g. FIG. 3b).

Figure 3A:
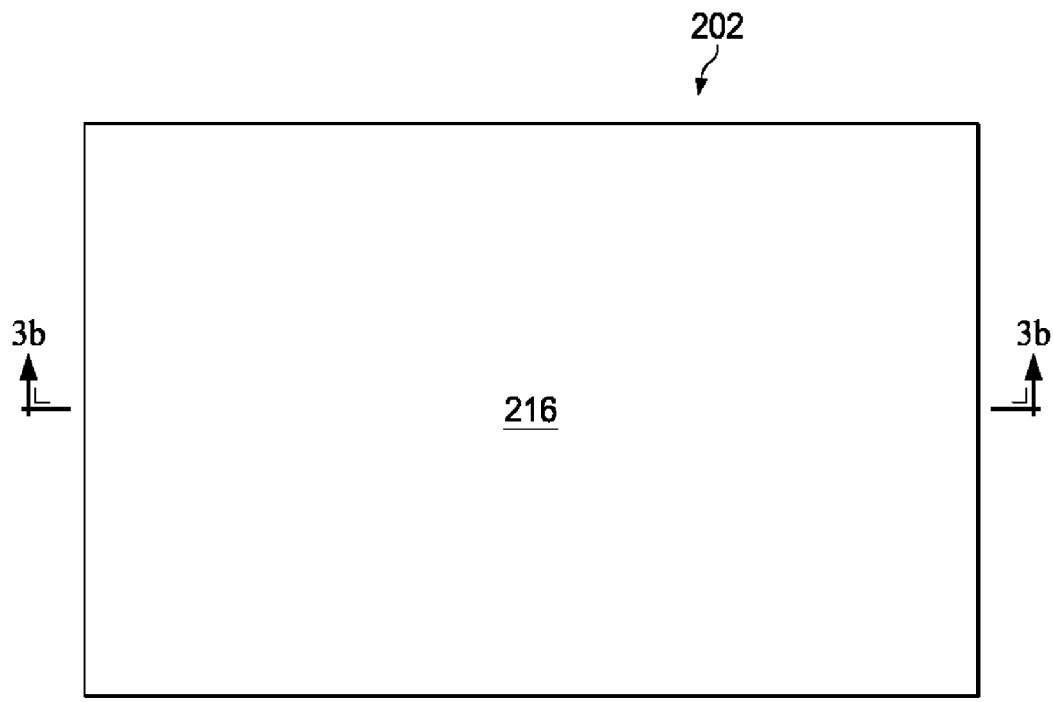
FIGS. 3a-14b are top and cross sectional views of forming the target pattern of FIG. 2 according to the method of FIG. 1, in accordance with an embodiment.
Figure 3B:
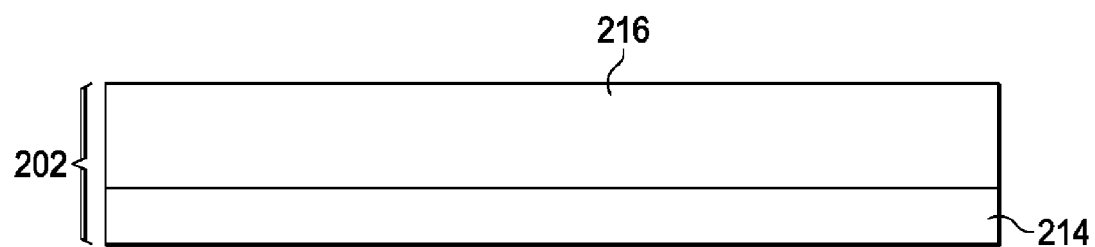

The method 100 (FIG. 1) receives a substrate 202 at operation 102. Referring to FIGS. 3a and 3b, in the present embodiment, the substrate 202 includes material layers 214 and 216. The material layer 216 may use amorphous silicon (a-Si), silicon oxide, silicon nitride (SiN), or other suitable material or composition. The material layer 214 may use nitrogen-free anti-reflection coating (NFARC), spin-on glass (SOG), titanium nitride, or other suitable material or composition. The material layers 214 and 216 may be formed by a variety of processes. For example, the material layer 214 may be formed over another substrate by a procedure such as deposition. In an embodiment, the material layer 216 may include silicon oxide formed by thermal oxidation. In an embodiment, the material layer 216 may include SiN formed by chemical vapor deposition (CVD). For example, the material layer 216 may be formed by CVD using chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$). The material layers 214 and 216 may be formed by a similar or a different procedure. The exemplary compositions of the material layers 214 and 216 aforementioned do not limit the inventive scope of the present disclosure.

Figure 4A:
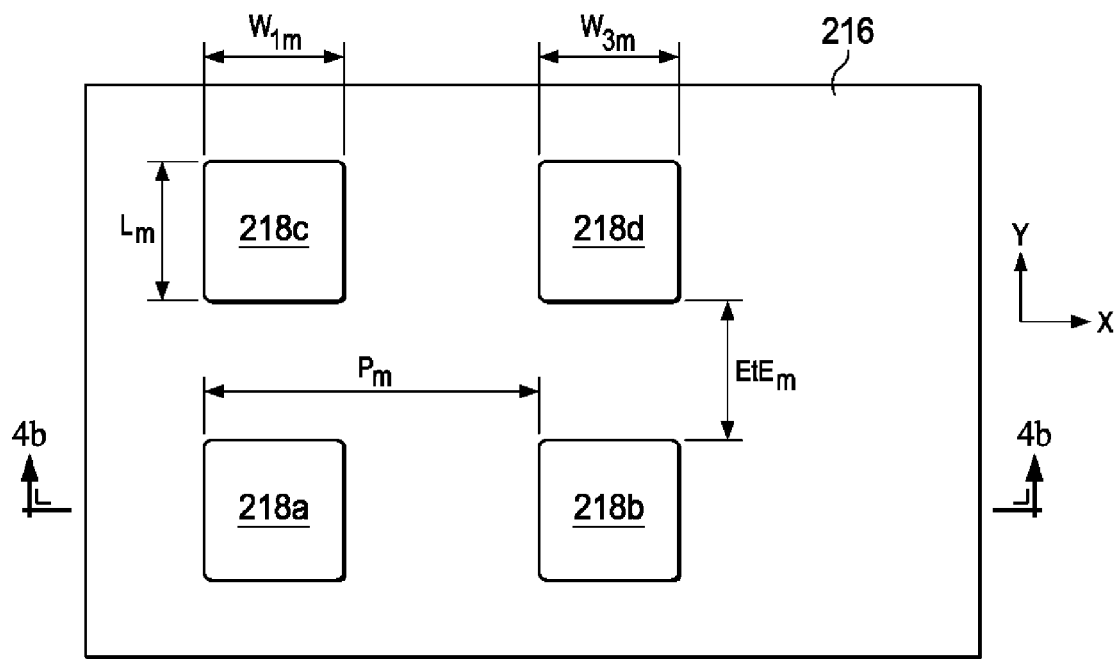
Figure 4B:
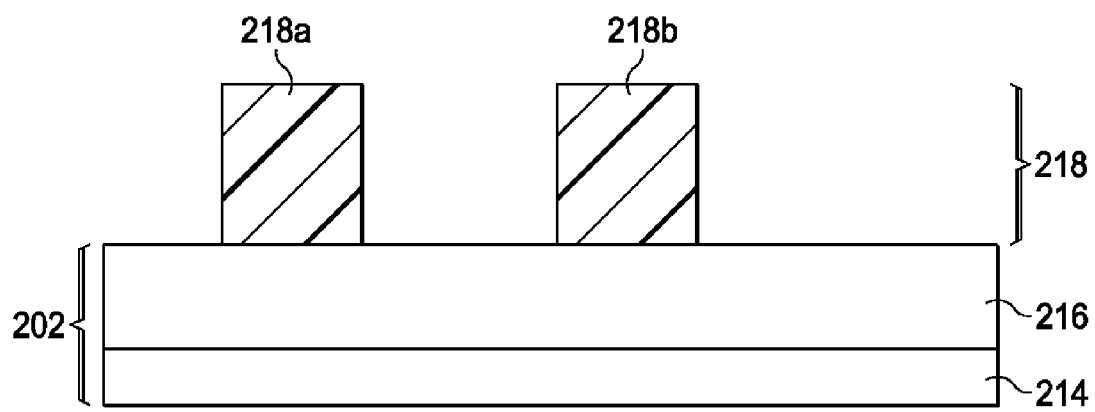

The method 100 (FIG. 1) proceeds to operation 104 by forming mandrel lines over the substrate 202 with the first mask through a suitable process, such as a process including a photolithography process. Referring to FIGS. 4a and 4b, mandrel lines 218a-d are formed over the substrate 202. The mandrel lines, 218a, 218c, 218b and 218d, are defined in the first mask corresponding to the features 180a-b and 184a-b (FIG. 2) respectively with a pitch $P_m$. The mandrel lines 218a-c (218b-d) have a first dimension $W_{1m}$ ($W_{3m}$) in X direction and a second dimension $L_m$ in Y direction. The dimensions $W_{1m}$, $W_{3m}$, and $L_m$ are greater than the corresponding dimensions $W_1$, $W_3$ and L (FIG. 2) respectively. This point will become clearer in a later section in conjunction with FIG. 15.

In an embodiment, the mandrel lines 218a-d are formed in a negative or positive resist (or photoresist) material in a photolithography process. An exemplary photolithography process includes coating a negative resist layer 218 over the material layer 216, soft baking the resist layer 218, and exposing the resist layer 218 to a deep ultraviolet (DUV) light using the first mask. The process further includes post-exposure baking (PEB), developing, and hard baking thereby removing unexposed portions of the resist layer 218 and leaving exposed portions of resist layer 218 on the substrate 202 as the mandrel lines 218a-d. In another embodiment, the mandrel lines 218a-d may be formed with unexposed portions of a positive resist material layer in a similar photolithography process.

Figure 17A:
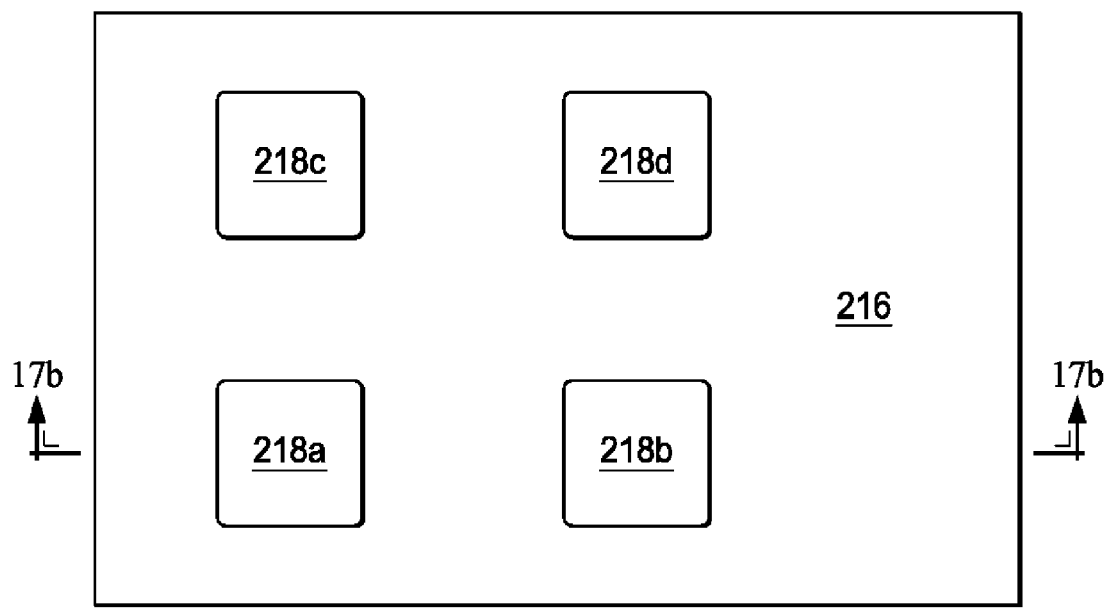
Figure 17B:
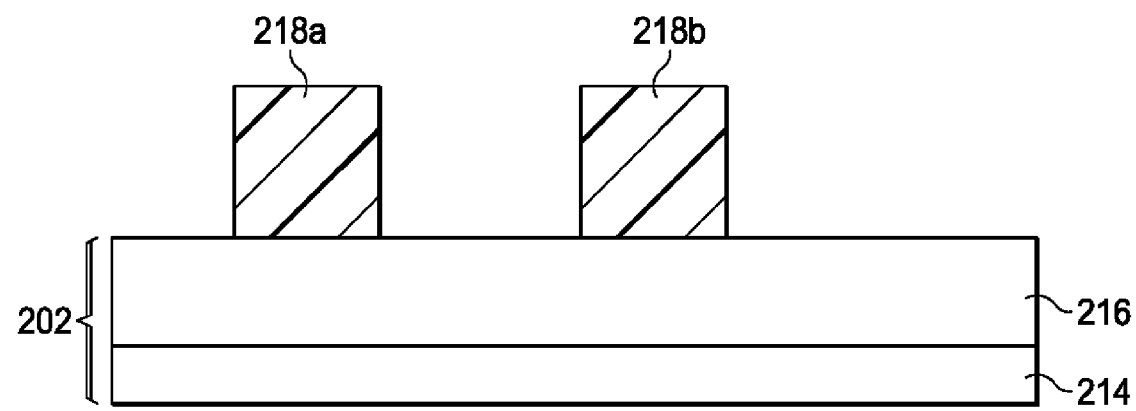

In another embodiment, the mandrel lines 218a-d may be formed in a hard mask layer using a photolithography process followed by an etching process. Referring to FIGS. 16a-17b, hard mask layers, 218(2) and 217, and a resist layer 219 are formed over the material layer 216. The resist layer 219 is patterned with the first mask through a photolithography process (FIGS. 16a and 16b), such as the photolithography process discussed above. The hard mask layer 217 is etched through the openings of the patterned resist layer 219 and the patterned resist layer 219 is thereafter removed using a suitable process, such as wet stripping or plasma ashing. The hard mask layer 218(2) is subsequently etched using the patterned hard mask layer 217 as an etch mask and the hard mask layer 217 is thereafter removed, leaving the mandrel lines 218a-d in the hard mask layer 218(2) (FIGS. 17a and 17b). In one example, etching the hard mask layer 217 includes applying a dry (or plasma) etch to remove the hard mask layer 217 within the openings of the patterned resist layer 219. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. The hard mask layer 218(2) may be etched using a similar or a different etching process.

Figure 5A:
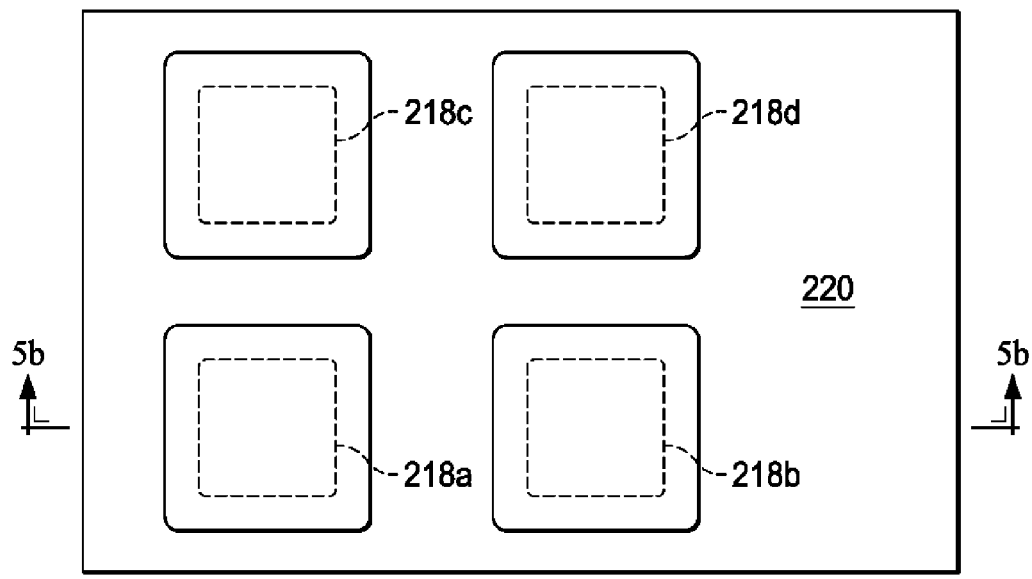
Figure 5B:
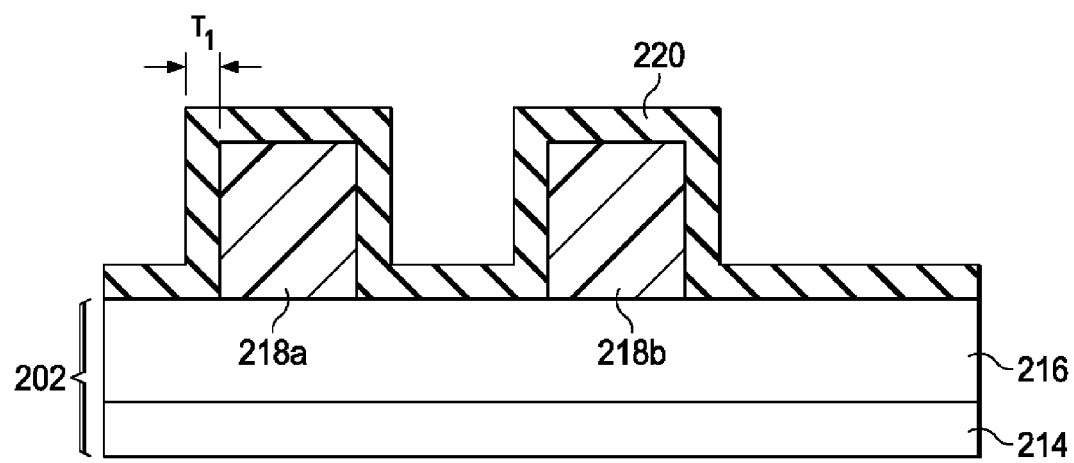

The method 100 (FIG. 1) proceeds to operation 106 by forming a first spacer layer 220 over the substrate 202 and over and around the mandrel lines 218a-d. Referring to FIGS. 5a and 5b, the first spacer layer 220 is formed over the substrate 202, more specifically, over the material layer 216. The first spacer layer 220 is also formed over the mandrel lines 218a-d and onto the sidewalls of the mandrel lines 218a-d. The first spacer layer 220 has a first thickness $T_1$. The first spacer layer 220 includes one or more material or composition different from the material layer 216 and the mandrel lines 218a-d. In an embodiment, the first spacer layer 220 may include a dielectric material, such as titanium nitride, silicon nitride, silicon oxide, or titanium oxide. The first spacer layer 220 may be formed by a suitable process, such as a deposition process. For example, the deposition process includes a chemical vapor deposition (CVD) process or a physical vapor deposition (PVD) process.

Figure 6A:
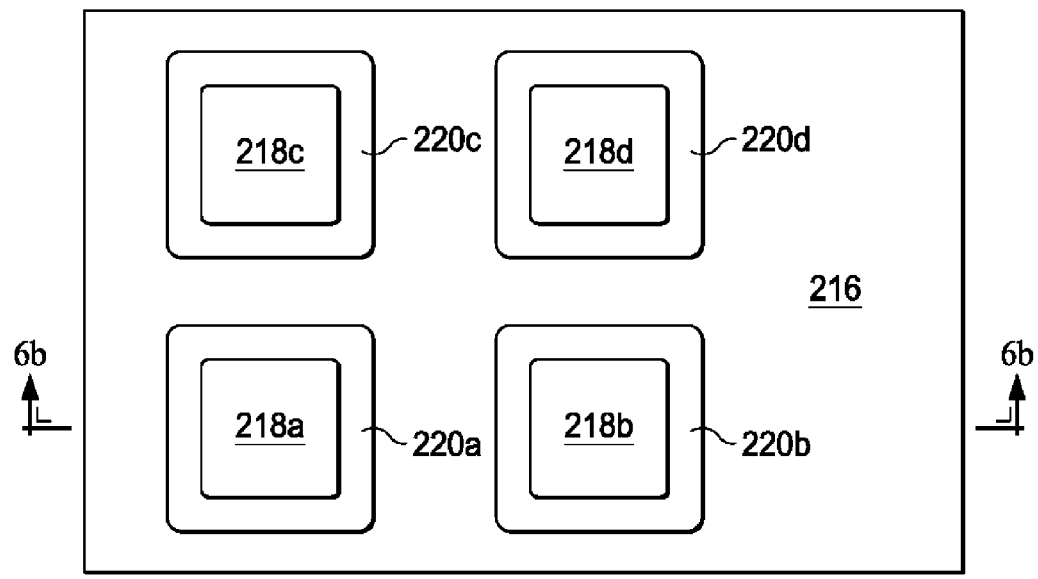
Figure 6B:
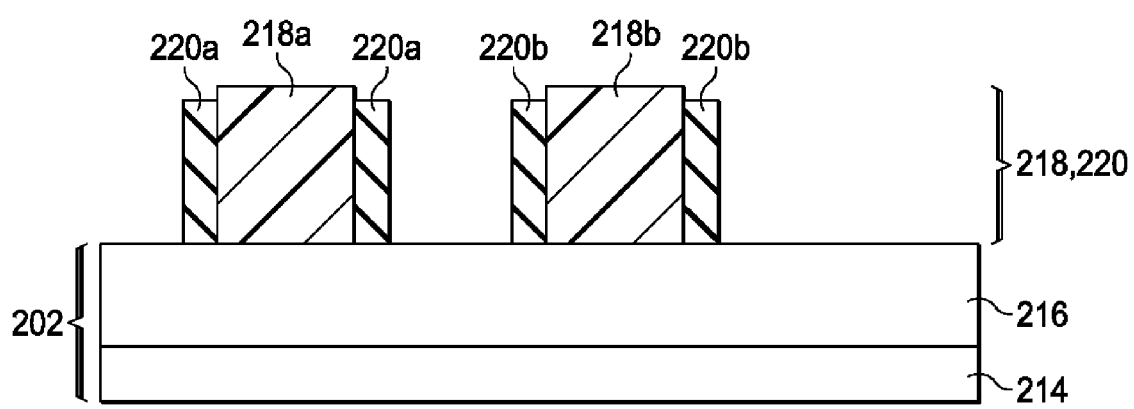

The method 100 (FIG. 1) proceeds to operation 108 by etching the first spacer layer 220 to expose the mandrel lines 218a-b and the material layer 216. Referring to FIGS. 6a and 6b, the top surfaces of the mandrel lines 218a and 218b are exposed by this etching process and the first spacer material disposed over the material layer 216 is also partially removed, providing first spacer features 220a-d on the sidewalls of the mandrel lines 218a-d respectively. In an embodiment, the process of etching the first spacer layer 220 includes an anisotropic etch such as plasma etch.

Figure 7A:
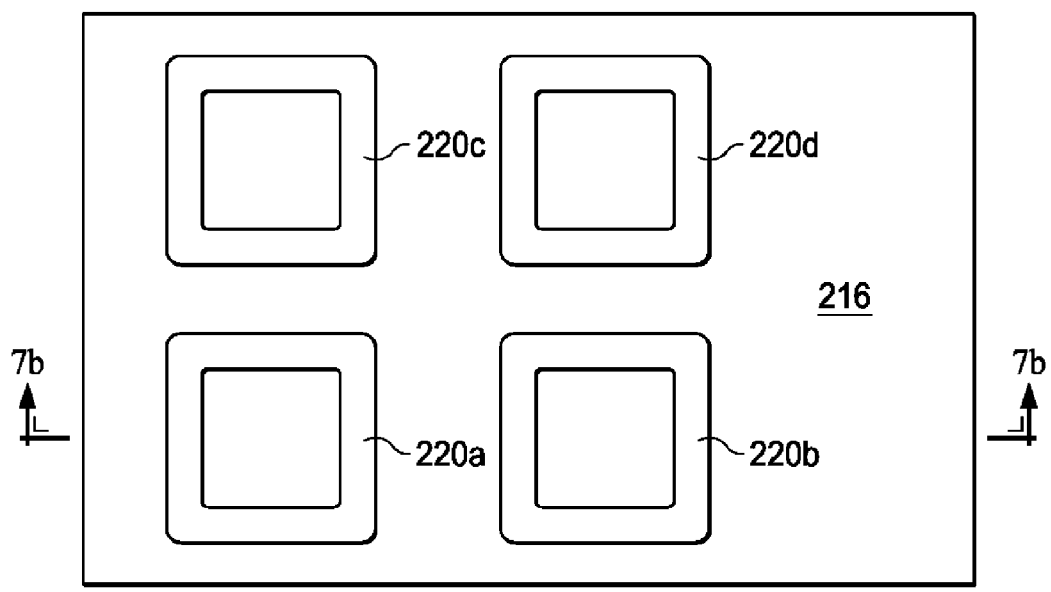
Figure 7B:
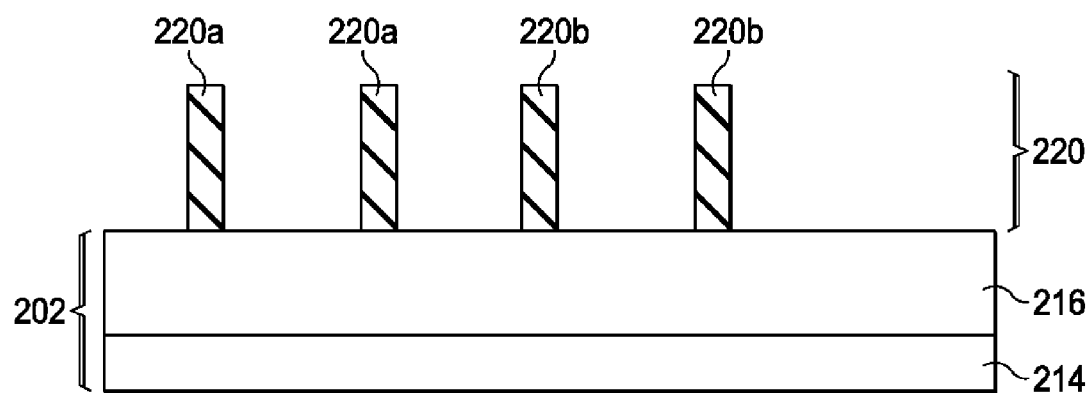

The method 100 (FIG. 1) proceeds to operation 110 by removing the mandrel lines 218a-d. Referring to FIGS. 7a and 7b, the mandrel lines 218a-d are removed, leaving the first spacer features 220a-d over the substrate 202. The mandrel lines 218a-d are removed using a process tuned to selectively remove the mandrel lines 218a-d while the first spacer features 220a-d remain.

Figure 8A:
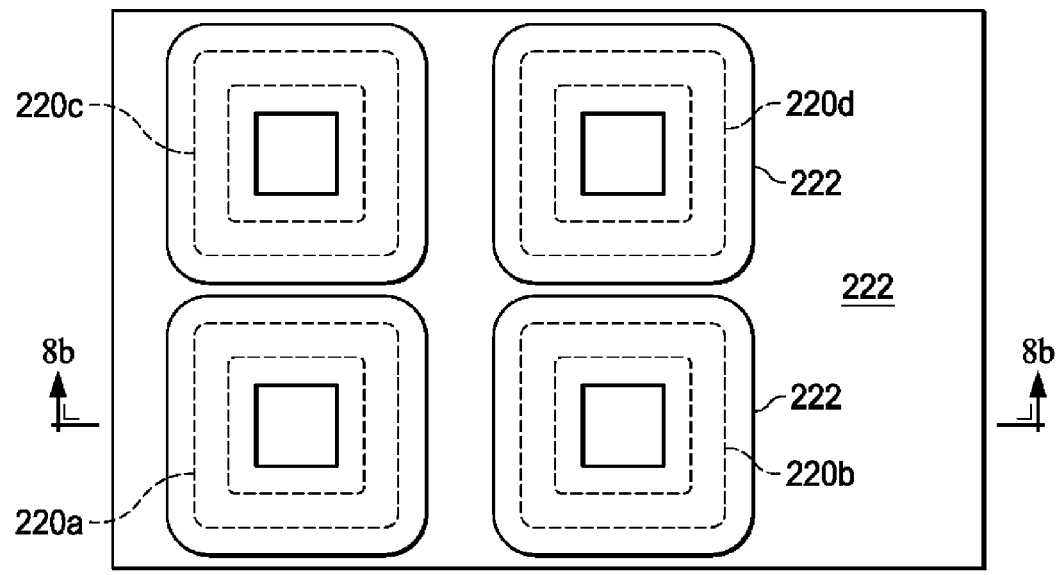
Figure 8B:
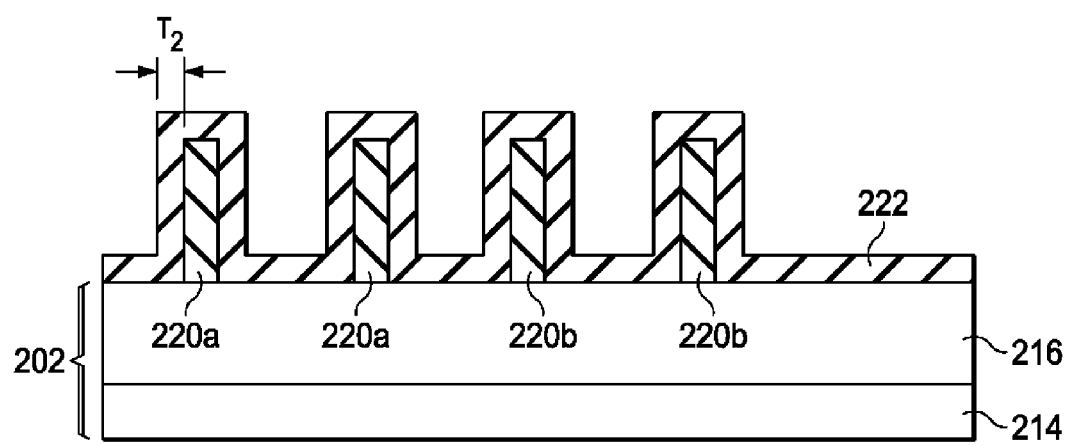

The method 100 (FIG. 1) proceeds to operation 112 by forming a second spacer layer 222 over the substrate 202 and over and around the first spacer features 220a-d. Referring to FIGS. 8a and 8b, the second spacer layer 222 is formed over the substrate 202, more specifically, over the material layer 216. The second spacer layer 222 is also formed over the first spacer features 220a-d and onto the sidewalls of the first spacer features 220a-d. The second spacer layer 222 has a second thickness $T_2$. The second spacer layer 222 includes one or more material or composition different from the material layer 216. The second spacer layer 222 may use the same or different material or composition from the first spacer layer 220. However, the materials used in the two spacer layers, 220 and 222, may have similar etch selectivity in order to prevent undesired micro-trench formation when the two spacer layers are etched in later steps. In an embodiment, the second spacer layer 222 may include a dielectric material, such as titanium nitride, silicon nitride, silicon oxide, or titanium oxide. The second spacer layer 222 may be formed by a suitable process, such as a deposition process. For example, the deposition process includes a chemical vapor deposition (CVD) process or a physical vapor deposition (PVD) process.

Figure 9A:
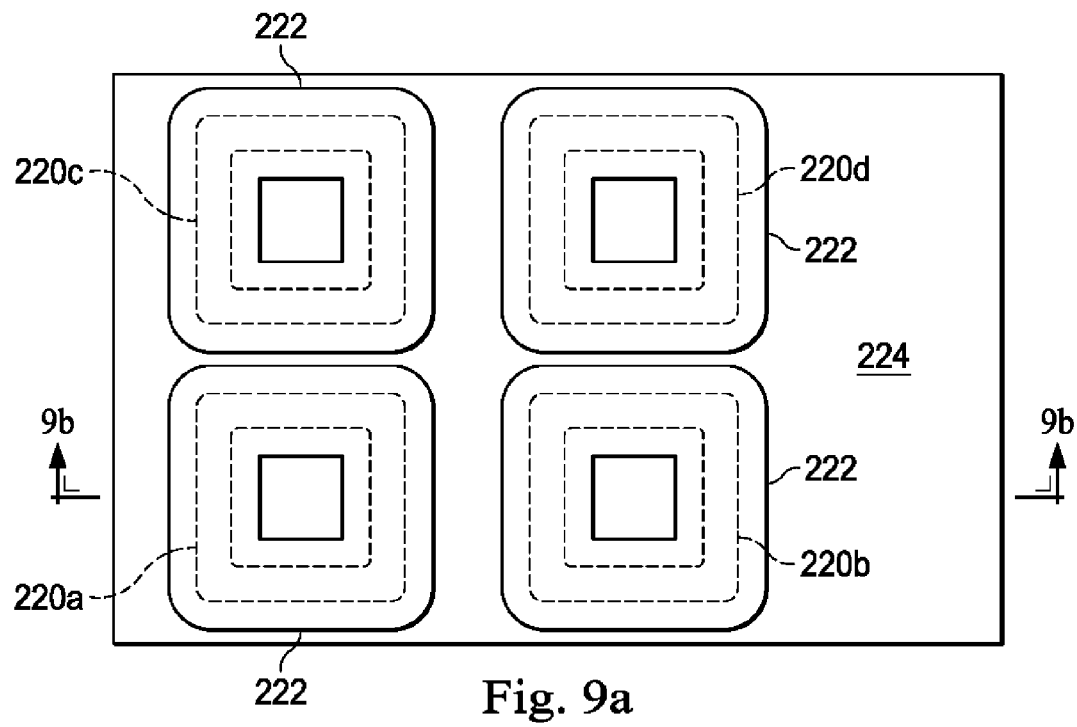
Figure 9B:
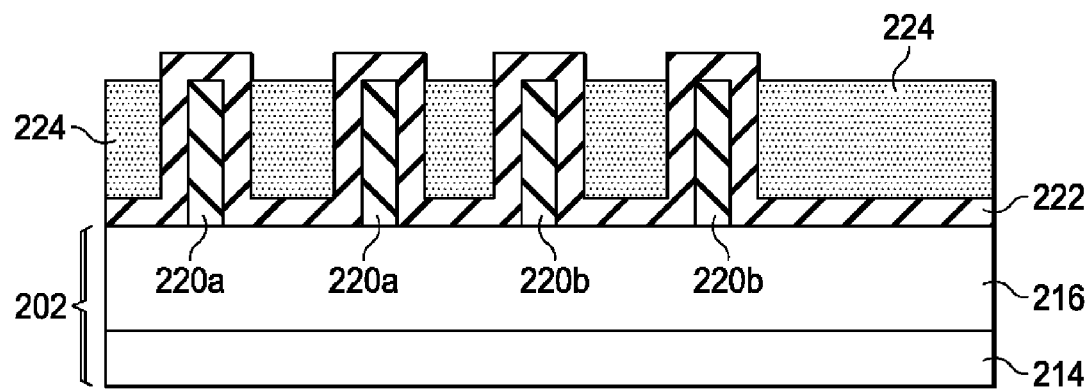

The method 100 (FIG. 1) proceeds to operation 114 by forming another material layer over the second spacer layer 222. Referring to FIGS. 9a and 9b, a material layer 224 is formed over the substrate 202 and over the second spacer layer 222. In an embodiment, the material layer 224 is first deposited over the second spacer layer 222 and is then partially removed such that the second spacer layer 222 over the top surfaces of the first spacer features, 220a-d, are exposed. The partial removal of the material layer 224 may be done by a procedure, such as a chemical mechanical polishing (CMP) or etch back. In an embodiment, the material layer 224 uses bottom anti-reflective coating (BARC) or spin-on glass (SOG).

The method 100 (FIG. 1) proceeds to operation 116 by forming trenches onto the material layer 224 and the second spacer layer 222 with the second mask. This operation includes a variety of processes such as a deposition process, a lithography process, and an etching process. It is illustrated in conjunction with FIGS. 10a-11b and FIGS. 18a-b.

Figure 10A:
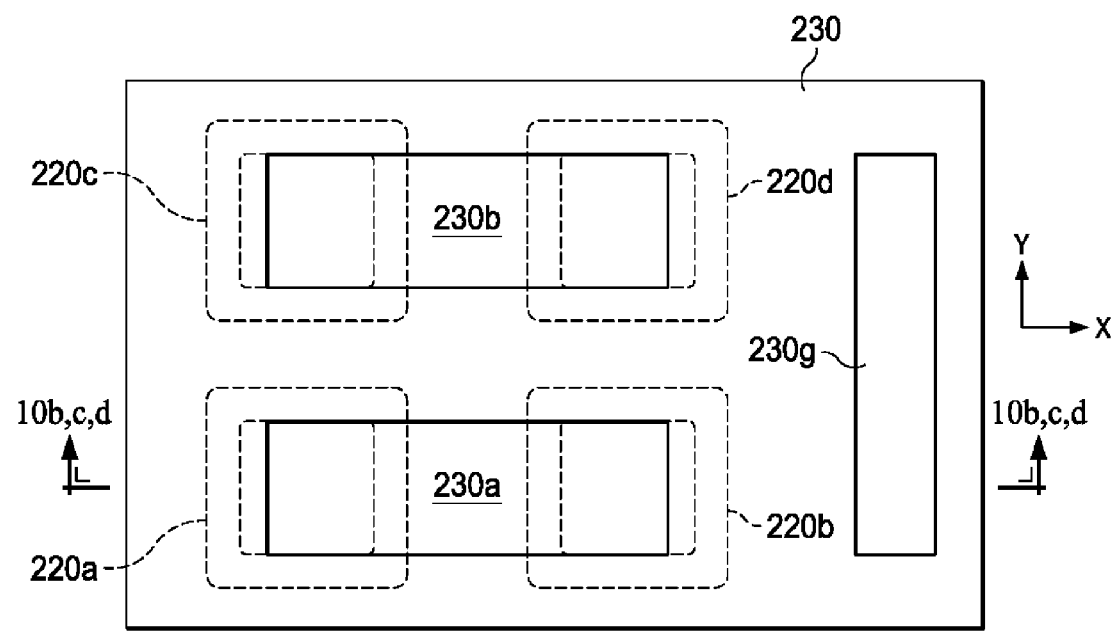
Figure 10B:
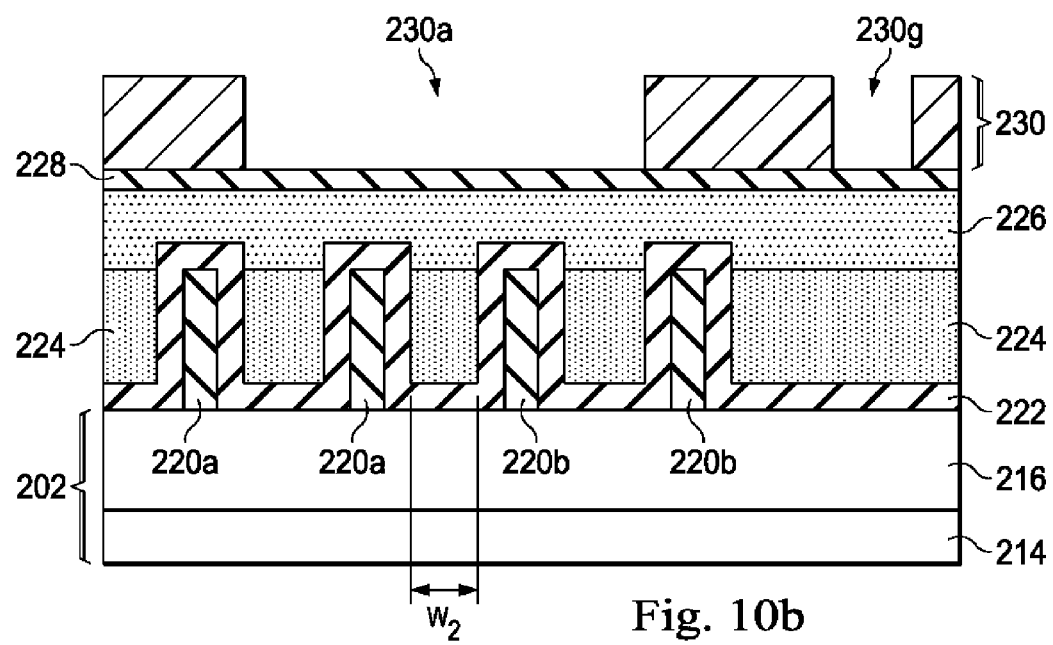
Figure 18A:
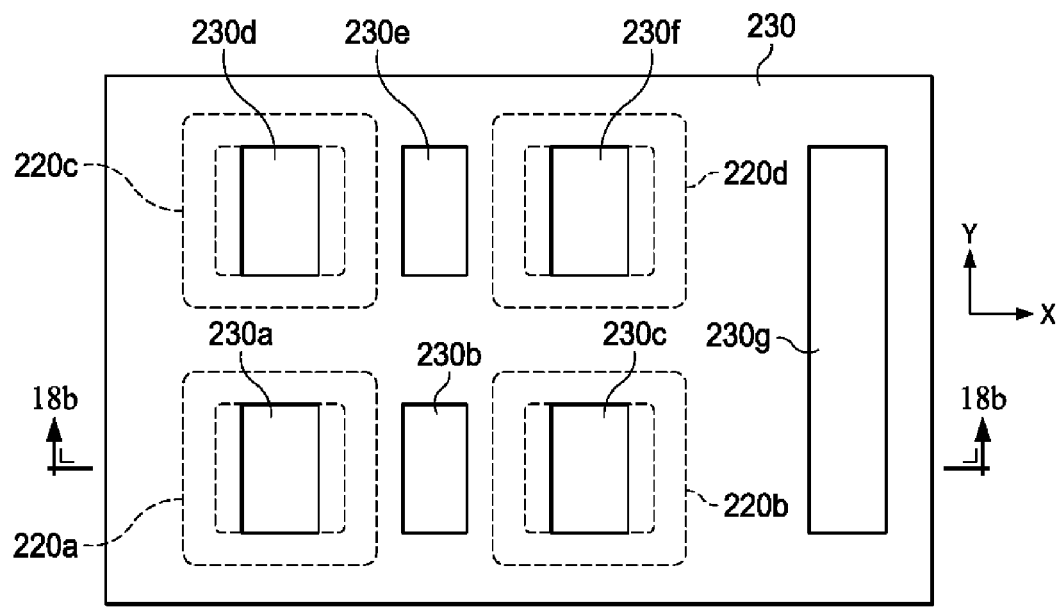
FIGS. 18a-18b are top and cross sectional views of forming trenches for the target pattern of FIG. 2 according to the method of FIG. 1, in accordance with an embodiment.
Figure 18B:
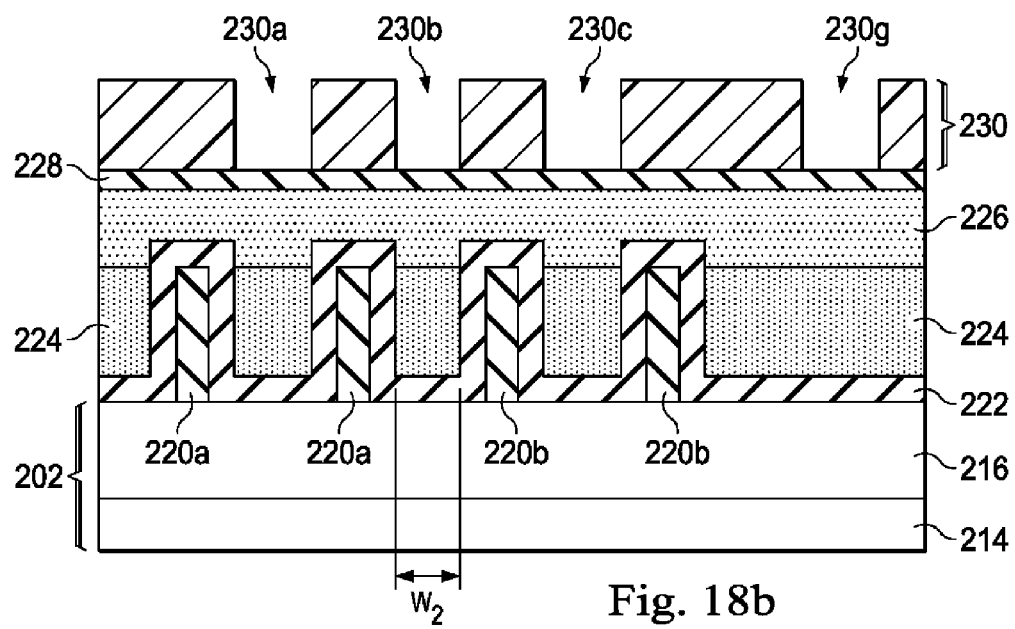

Referring to FIGS. 10a and 10b, a material layer 226 is deposited over the second spacer layer 222 and the material layer 224. A polishing process may be subsequently performed to the material layer 226. A hard mask layer 228 is deposited over the material layer 226. In an embodiment, the material layer 226 may be a Bottom Anti-Reflective Coating (BARC) layer while the hard mask layer 228 may be made of silicon. In another embodiment, instead of using two material layers 226 and 228, one material layer may be used. A resist layer 230 is formed on the hard mask layer 228, and is patterned with the second mask as trenches using a lithography process. In the present embodiment, the second mask includes three patterns, 230a, 230b, and 230g, as trenches. The pattern 230a overlaps with the first spacer features 220a and 220b thereby defining trenches for the features 180a, 182a, and 184a (FIG. 2). The pattern 230b overlaps with the first spacer features 220c and 220d thereby defining trenches for the features 180b, 182b, and 184b (FIG. 2). These trench definitions are attributable to the dimensions and the pitch of the mandrel lines 218a-d (FIG. 4a), the first thickness $T_1$ (FIG. 5b), and the second thickness $T_2$ (FIG. 8b). This point will be discussed in details in conjunction with FIG. 15. In the present embodiment, the spacing between the outer surfaces of the second spacer layer 222 disposed over the first spacer features 220a and 220b is tuned to be equal to the width, $W_2$, of the feature 182. In another embodiment as shown in FIGS. 18a and 18b, when the spacing between the outer surfaces of the second spacer layer 222 disposed over the first spacer features 220a and 220b is greater than $W_2$, the second mask includes six patterns 230a-f. In this regard, FIG. 10a may be viewed as a special case of FIG. 18a where the patterns 230a-c of FIG. 18a merge into the pattern 230a of FIG. 10a and the patterns 230d-f of FIG. 18a merge into the pattern 230b of FIG. 10a.

Figure 10C:
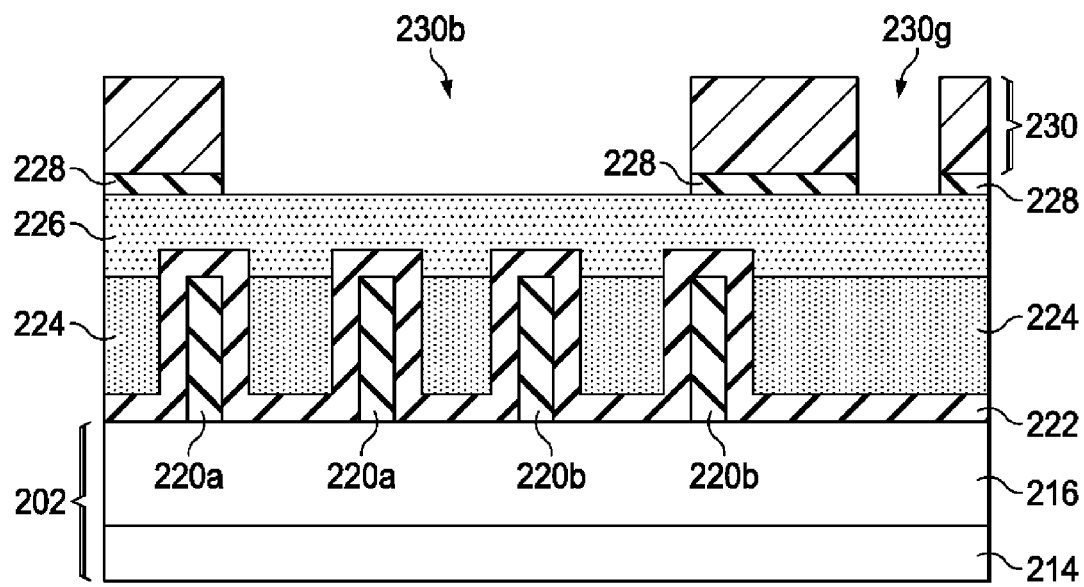

Referring to FIG. 10c, the hard mask layer 228 is patterned by etching through the openings of the patterned resist layer 230. In one example, the etching process includes applying a dry (or plasma) etch to remove the hard mask layer 228 within the openings of the patterned resist layer 230. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In an embodiment, after the hard mask layer 228 has been patterned, the patterned resist layer 230 is removed or partially removed using a suitable process, such as wet stripping or plasma ashing.

Figure 10D:
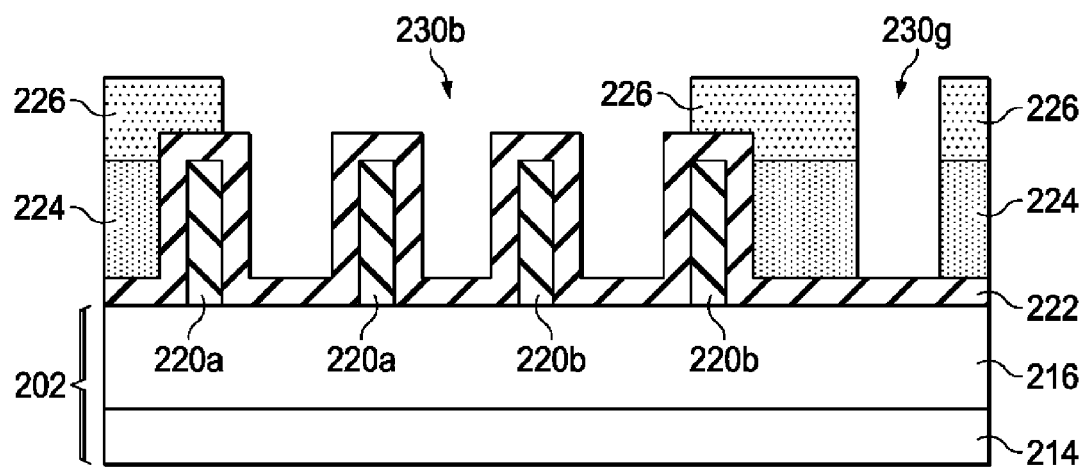

Referring to FIG. 10d, after the hard mask layer 228 has been patterned, the material layers 226 and 224 are etched with the patterned hard mask layer 228 as an etch mask using a suitable process, such as an etching process tuned to selectively remove the material layers 226 and 224 while the second spacer layer 222 remains. In an embodiment, any remaining portions of the resist layer 230 after the hard mask layer 228 patterning step are also removed by such etching process. In an embodiment, any remaining portions of the hard mask layer 228 after the material layers 226 and 224 patterning step are also removed by such etching process. The material layers 228 and 226 are removed thereafter using a suitable process, such as an etching process tuned to selectively remove the material layers 228 and 226 while the material layer 224 and the second spacer layer 222 remain.

Figure 11A:
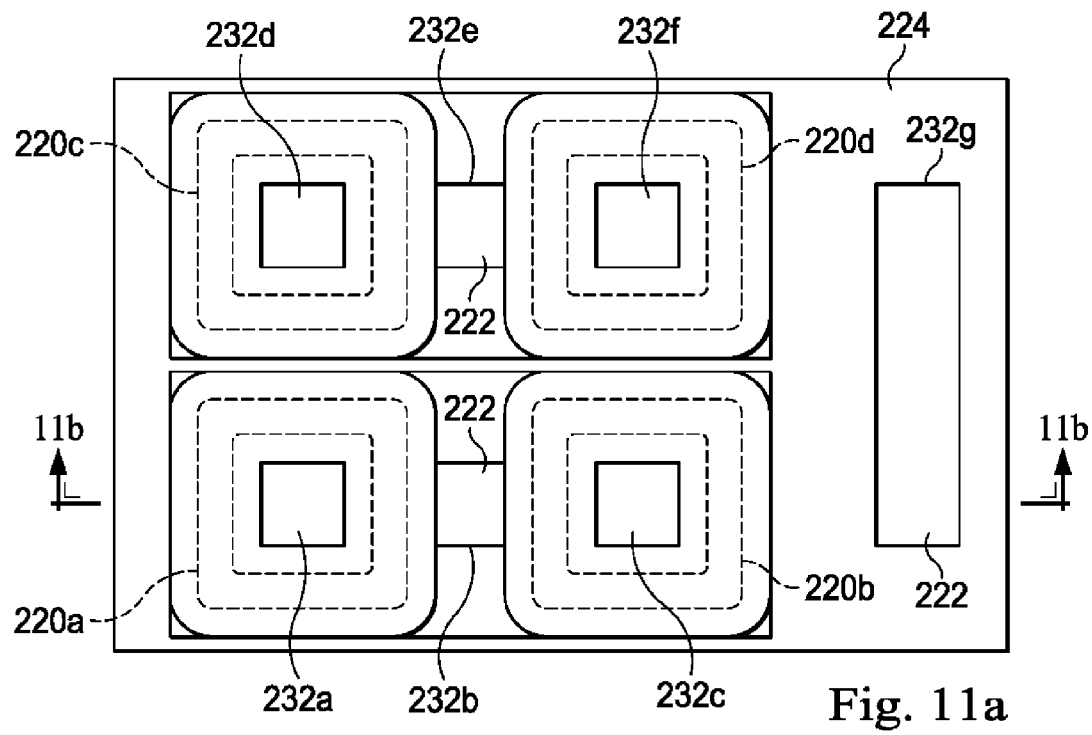
Figure 11B:
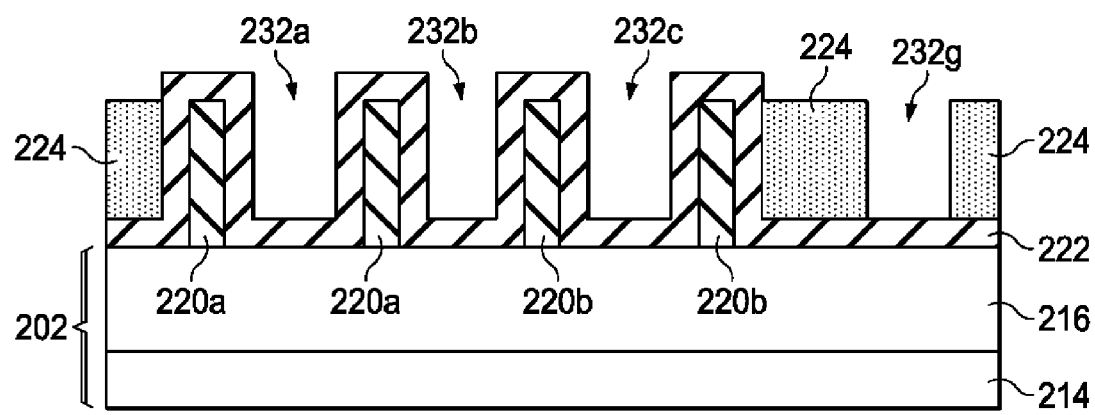

Referring to FIGS. 11a and 11b, trenches 232a-g are formed into the material layer 224 and the second spacer layer 222 by the above etching processes.

Figure 12A:
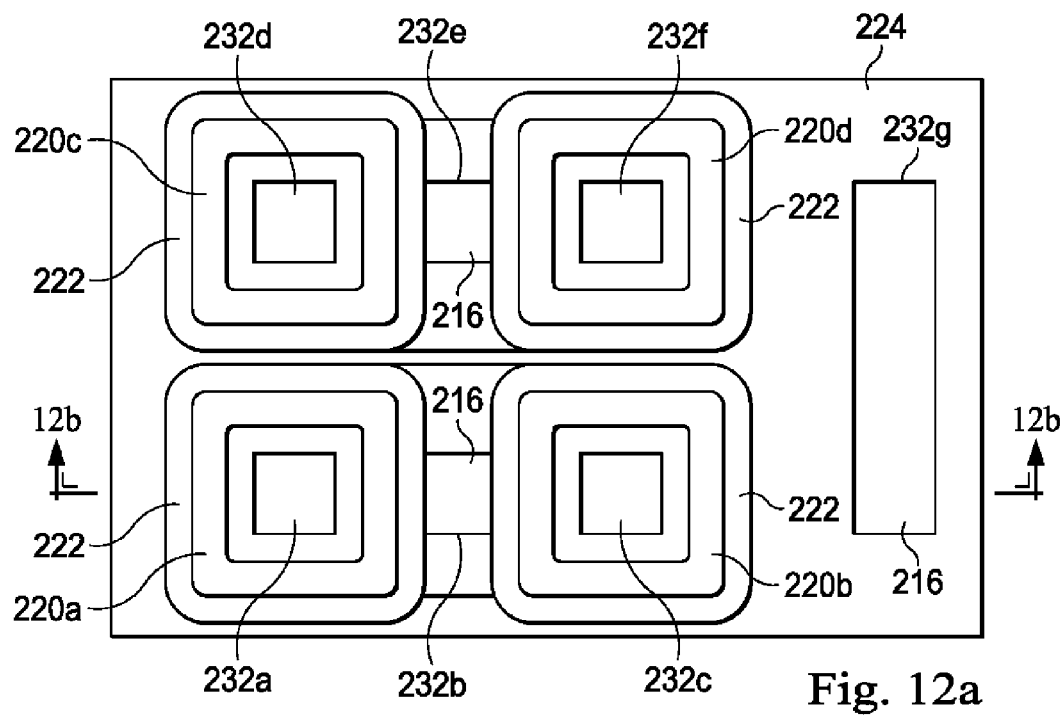
Figure 12B:
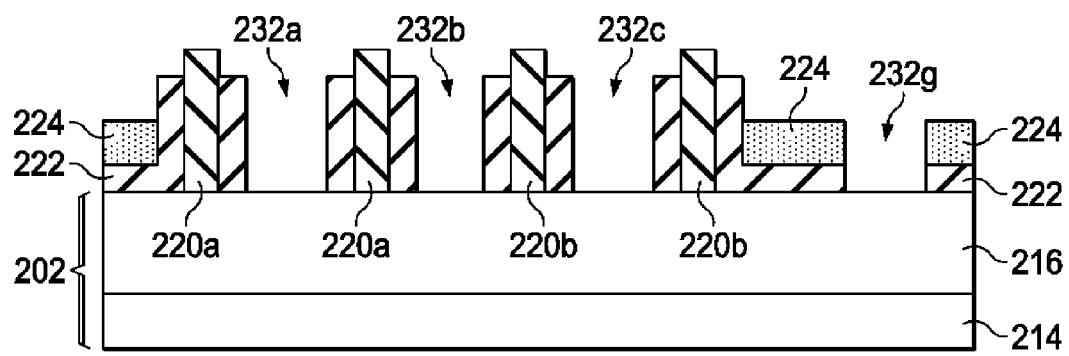
Figure 13A:
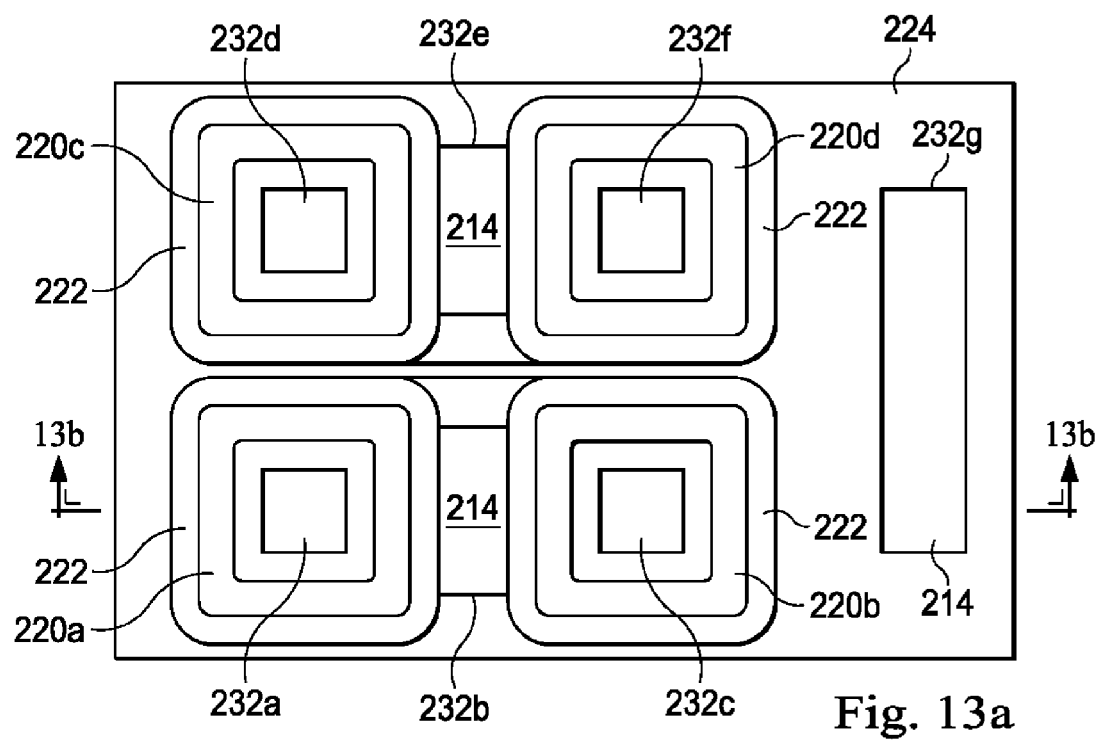
Figure 13B:
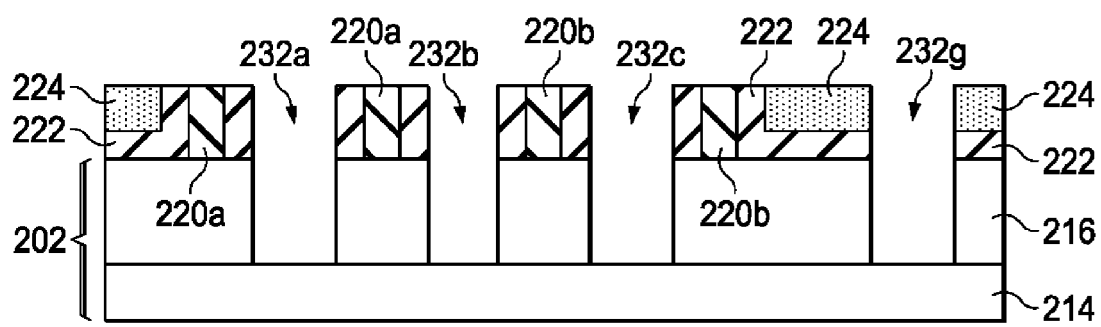

The method 100 (FIG. 1) proceeds to operation 118 by etching the second spacer layer 222 to expose the material layer 216. Referring to FIGS. 12a and 12b, the second spacer material disposed over the material layer 216 is removed at the bottom of the trenches 232a-g. The first spacer features 220a-d may also be exposed by the etching process and may be partially removed. The material layer 224 may be partially removed by the etching process. In an embodiment, the process of etching the second spacer layer includes an anisotropic etch such as plasma etch. As a result of the operation 118, the first and second spacer layers, 220 and 222, and the material layer 224 are patterned with a plurality of openings and the plurality of openings corresponds to the features, 180a-b, 182a-b, 184a-b, and 186, of the target pattern 200 (FIG. 2).

Figure 14A:
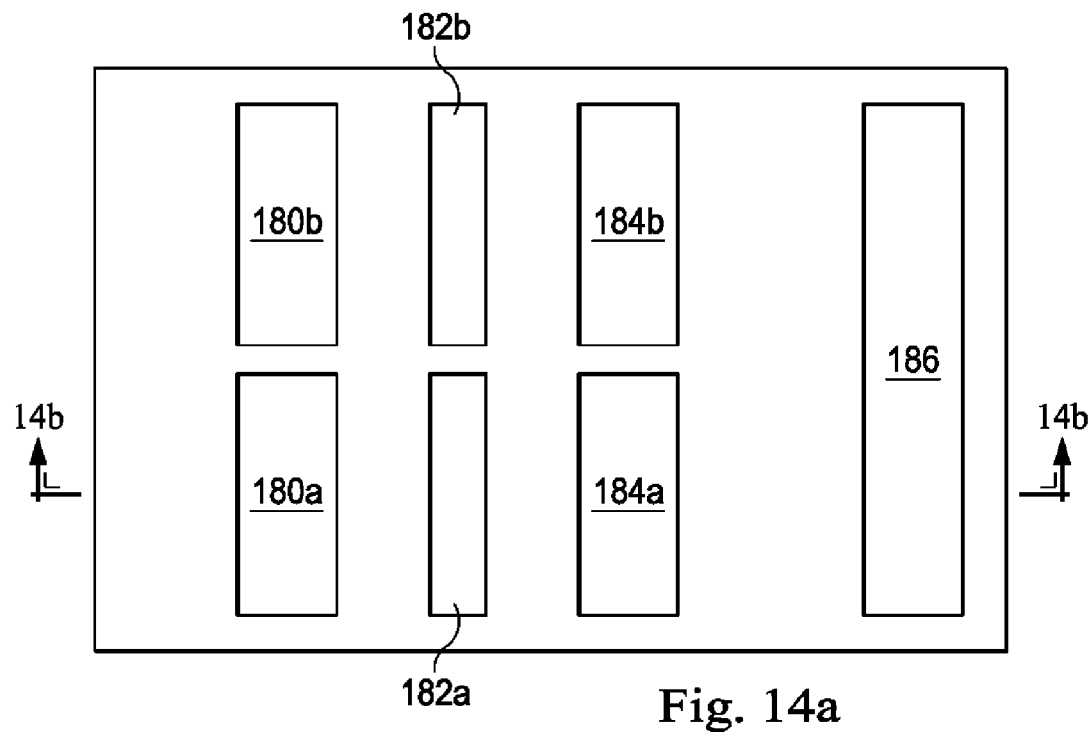
Figure 14B:
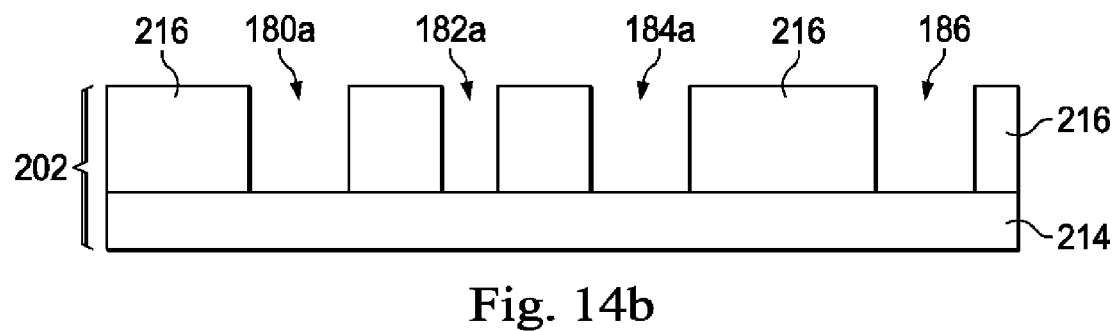

The method 100 (FIG. 1) proceeds to operation 120 by transferring the pattern from the spacer layers, 220 and 222, and the material layer 224 to the material layer 216 (FIGS. 13a and 13b) using a suitable process such as an anisotropic etching process. The spacer layers, 220 and 222, and the material layer 224 are thereafter removed (FIGS. 14a and 14b). Referring to FIGS. 14a and 14b, a pattern is formed in the material layer 216, matching the target pattern 200 (FIG. 2).

The method 100 (FIG. 1) proceeds to operation 122 to form a final pattern or device with the patterned material layer 216. In an embodiment, a target pattern is to be formed as metal lines in a multilayer interconnection structure. For example, the metal lines may be formed in an inter-layer dielectric (ILD) layer. In such a case, the operation 122 forms a plurality of trenches in the ILD layer using the patterned material layer 216; fills the trenches with a conductive material, such as a metal; and polishes the conductive material using a process such as chemical mechanical polishing to expose the patterned ILD layer, thereby forming the metal lines in the ILD layer.

In another embodiment, the operation 122 forms fin field effect transistor (FinFET) structures on a semiconductor substrate using the patterned material layer 216. In this embodiment, the operation 122 forms a plurality of trenches in the semiconductor substrate. Shallow trench isolation (STI) features are further formed in the trenches by a procedure that includes deposition to fill the trenches with a dielectric material and polishing (such as CMP) to remove excessive dielectric material and to planarize the top surface of the semiconductor substrate. Thereafter, a selective etch process is applied to the dielectric material to recess the STI features, thereby forming fin-like active regions.

Figure 15:
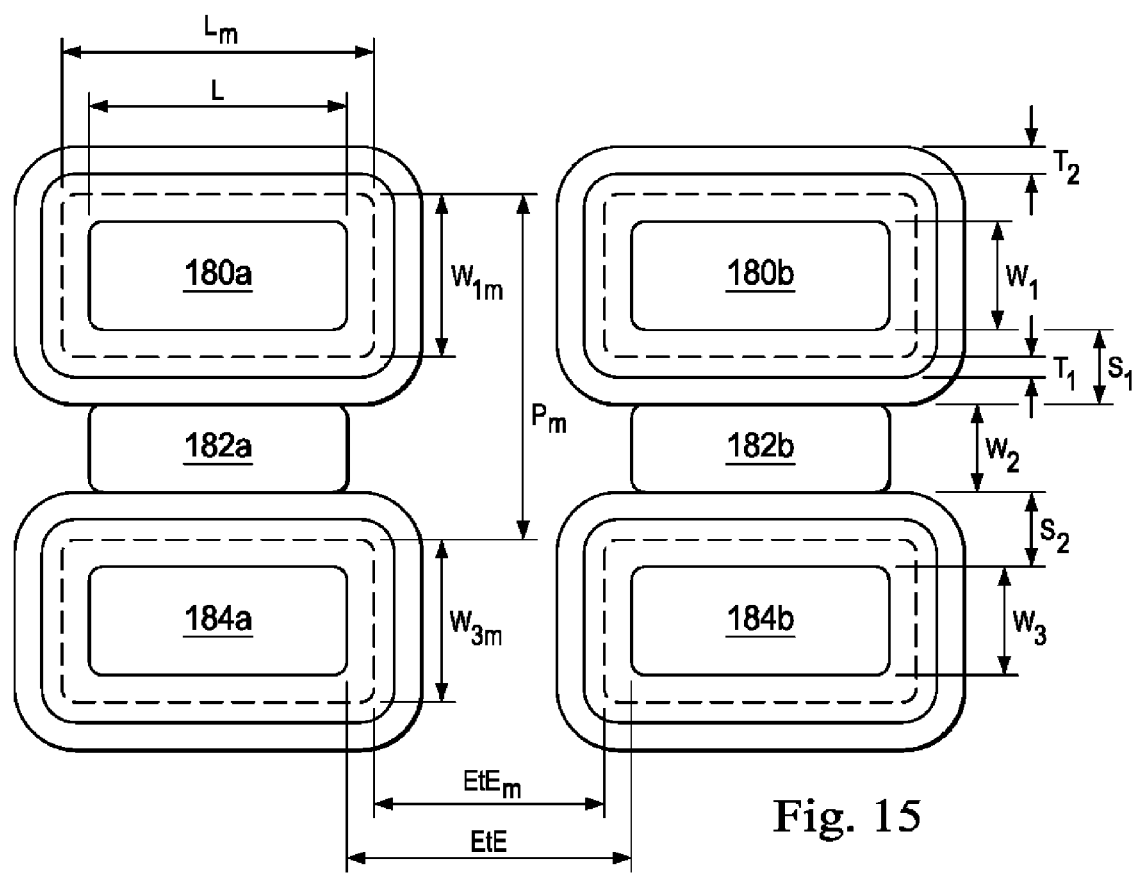
FIG. 15 illustrates a final pattern with various dimensions that can be tuned according to various aspects of the present disclosure.
Figure 16A:
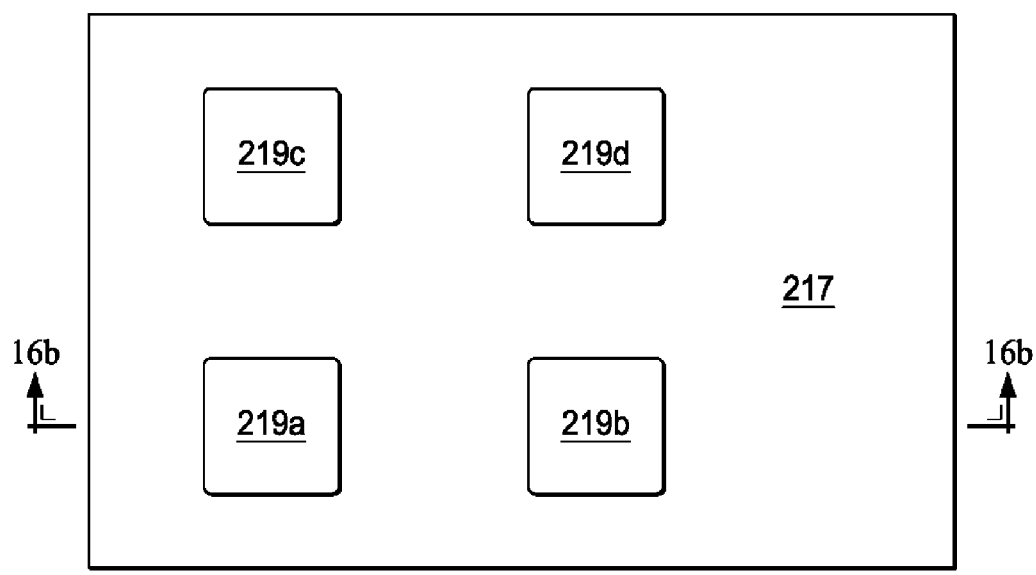
FIGS. 16a-17b are top and cross sectional views of forming mandrel lines for the target pattern of FIG. 2 according to the method of FIG. 1, in accordance with an embodiment.
Figure 16B:
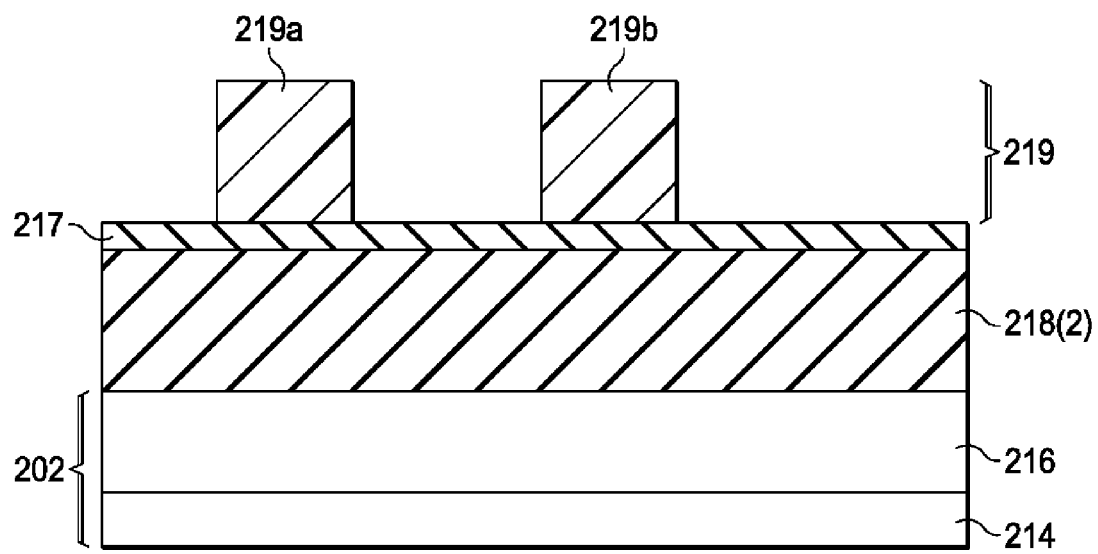

FIG. 15 illustrates the relationship among the various dimensions of the target pattern 200 (FIG. 2), the various dimensions of the mandrel lines 218a-d (FIG. 4a), the thickness $T_1$ of the first spacer layer 220 (FIG. 5b), and the thickness $T_2$ of the second spacer layer 222 (FIG. 8b). Referring to FIG. 15, which may be viewed as a part of the FIG. 13a rotated clockwise by 90 degrees, the various aforementioned dimensions have the following:

$$L_m = L + 2 \times T_2 \quad (1)$$

$$W_{1m} = W_1 + 2 \times T_2 \quad (2)$$

$$W_{3m} = W_3 + 2 \times T_2 \quad (3)$$

$$P_m = W_1 + W_2 + 2 \times T_1 + 4 \times T_2 \quad (4)$$

$$S_1 \geq T_1 + 2 \times T_2 \quad (5)$$

$$S_2 \geq T_1 + 2 \times T_2 \quad (6)$$

$$EtE = EtE_m + 2 \times T_2 \quad (7)$$

The present disclosure provides various advantages over the traditional spacer techniques where a pattern is trimmed before a spacer is formed over the pattern. One advantage is that a smaller EtE can be achieved by tuning the thickness $T_2$. By way of example, in a process P using the traditional spacer techniques, the width of the mandrel lines 218a-d is reduced by T in the trimming process so that the width meets a final pattern pitch. The length of the mandrel lines 218a-d is also reduced by approximately T by the same trimming process. Consequently, the end to end distance between the mandrel lines 218a-d are increased from $EtE_m$ to ($EtE_m + 2 \times T$) which is about the same as the end to end distance of the final pattern by the process P. In contrast, in the present embodiment, the thickness $T_2$ can be tuned to be smaller than T, which indirectly reduces the end to end distance of the final pattern (see Equation (7) above). In addition to a reduced EtE distance, the width and length of the features 180a-b, 182a-b, and 184a-b, of the target pattern 200 as well as the spacing among them can be made smaller by tuning the thickness $T_1$ and $T_2$. This generally provides benefits of increased pattern density. Another advantage of the present embodiment is cost saving because (1) the present embodiment avoids mandrel line trimming processes and (2) the resist layer 218 (FIG. 4b) can be made thinner.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a method of forming a target pattern for an integrated circuit (IC). The method includes forming a plurality of lines over a substrate with a first mask; forming a first spacer layer over the substrate, over the plurality of lines, and onto sidewalls of the plurality of lines; removing at least a portion of the first spacer layer to expose the plurality of lines; removing the plurality of lines thereby providing a patterned first spacer layer over the substrate; forming a second spacer layer over the substrate, over the patterned first spacer layer, and onto sidewalls of the patterned first spacer layer; and forming a patterned material layer over the second spacer layer with a second mask thereby the patterned material layer and the second spacer layer collectively define a plurality of trenches.

In another exemplary aspect, the present disclosure is directed to a method of forming a pattern over a substrate having a plurality of hard mask layers. The method includes forming lines over the substrate; depositing a first material to a first thickness over the substrate, over the lines and onto sidewalls of the lines; removing the lines thereby providing a patterned first material over the substrate; depositing a second material to a second thickness over the substrate, over the patterned first material, and onto sidewalls of the patterned first material; depositing a third material over the second material; and patterning the second and third materials to form trenches.

In yet another exemplary aspect, the present disclosure is directed to a method of forming a target pattern for an integrated circuit. The method includes decomposing the target pattern to at least a first mask, the first mask having a first mask pattern, and a second mask, the second mask having a second mask pattern, wherein at least a portion of the first mask pattern overlaps with at least a portion of the second mask pattern. The method further includes patterning a substrate with the first mask thereby forming a first plurality of features; forming a first spacer layer over the substrate, over the first plurality of features, and onto the sidewalls of the first plurality of features; partially removing the first spacer layer to expose the substrate and the first plurality of features, and thereafter removing the first plurality of features. The method further includes forming a second spacer layer over the substrate, over the first spacer layer, and onto the sidewalls of the first spacer layer; forming a first material layer over the second spacer layer; and patterning the first material layer with the second mask wherein the second spacer layer and the patterned first material layer collectively define a second plurality of features.

What is claimed is:

1. A method of forming a target pattern for an integrated circuit, the method comprising:
   providing a patterned first spacer layer over a substrate;
   forming a second spacer layer over the substrate, over the patterned first spacer layer, and onto sidewalls of the patterned first spacer layer; and
   forming a patterned material layer over the second spacer layer with a second mask, whereby the patterned material layer and the second spacer layer collectively define a plurality of trenches, and wherein the second spacer layer remains formed over the patterned first spacer layer and on the sidewalls of the patterned first spacer layer after the plurality of trenches are defined.

2. The method of claim 1, further comprising:
   transferring the plurality of trenches to the substrate.

3. The method of claim 1, further comprising:
   etching the second spacer layer through openings of the plurality of trenches to expose the substrate;
   etching the substrate through the openings of the plurality of trenches; and
   after etching, removing the patterned first spacer layer, the second spacer layer, and the patterned material layer.

4. The method of claim 1, further comprising:
   forming a plurality of lines over the substrate with a first mask;
   forming a first spacer layer over the substrate, over the plurality of lines, and onto sidewalls of the plurality of lines;
   removing at least a portion of the first spacer layer to expose the plurality of lines; and
   removing the plurality of lines to provide the patterned first spacer layer.

5. The method of claim 4, wherein the forming the plurality of lines includes:
   forming a resist layer over the substrate; and
   patterning the resist layer with the first mask.

6. The method of claim 4, wherein the forming the plurality of lines includes:
   forming a hard mask layer over the substrate;
   forming a resist layer over the hard mask layer;
   patterning the resist layer with the first mask;
   etching the hard mask layer using the patterned resist layer as an etch mask; and
   thereafter removing the patterned resist layer.

7. The method of claim 1, wherein the forming the patterned material layer includes:
   forming a first material layer over the second spacer layer;
   forming a second material layer over the first material layer and the second spacer layer;
   patterning the second material layer with the second mask;
   etching the first material layer using the patterned second material layer as an etch mask; and
   thereafter removing the patterned second material layer.

8. The method of claim 7, further comprising:
   etching back the first material layer to expose the second spacer layer before forming the second material layer.

9. The method of claim 7, wherein the patterning the second material layer uses a photolithography process including:
   forming a resist layer over the second material layer;
   patterning the resist layer with the second mask;
   etching the second material layer using the patterned resist layer as an etch mask; and
   thereafter removing the patterned resist layer.

10. The method of claim 7, wherein the etching the first material layer includes a process selectively tuned to remove the first material layer using the patterned second material layer as an etch mask while the second spacer layer remains.

11. The method of claim 4, wherein the removing at least a portion of the first spacer layer is performed using an anisotropic etching process.

12. The method of claim 4, wherein the removing the plurality of lines is performed using a plasma etching process.

13. The method of claim 4, wherein a dimension of at least one of the plurality of trenches is defined, at least in part, by a pattern space of the first mask and a thickness of the first and second spacer layers over the sidewalls of the plurality of lines.

14. A method comprising:
    providing a patterned first material over a substrate, the substrate including a plurality of hard mask layers;
    depositing a second material to a second thickness over the substrate, over the patterned first material, and onto sidewalls of the patterned first material;
    depositing a third material over the second material; and
    patterning the second and third materials to form trenches, wherein the second material remains deposited over the patterned first material and on the sidewalls of the patterned first material.

15. The method of claim 14, further comprising:
    forming lines over the substrate;
    transferring the lines to at least one hard mask layer of the plurality of hard mask layers;
    after transferring the lines to the at least one hard mask layer, depositing a first material to a first thickness over the substrate, over the lines and onto sidewalls of the lines; and
    removing the lines to provide the patterned first material.

16. The method of claim 15, further comprising, before the removing the lines, removing at least a portion of the first material to expose the lines.

17. The method of claim 14, further comprising, etching the substrate through openings of the trenches.

18. A method of forming a target pattern for an integrated circuit, the method comprising:
    decomposing the target pattern to at least a first mask, the first mask having a first mask pattern, and a second mask, the second mask having a second mask pattern, wherein at least a portion of the first mask pattern overlaps with at least a portion of the second mask pattern;
    providing a patterned first spacer layer over a substrate;
    forming a second spacer layer over the substrate, over the patterned first spacer layer, and onto the sidewalls of the patterned first spacer layer;

forming a first material layer over the second spacer layer; and patterning the first material layer with the second mask wherein the second spacer layer and the patterned first material layer collectively define a second plurality of features.

19. The method of claim 18, further comprising:

patterning the substrate with the first mask thereby forming a first plurality of features;

forming a first spacer layer over the substrate, over the first plurality of features, and onto the sidewalls of the first plurality of features;

partially removing the first spacer layer to expose the substrate and the first plurality of features; and removing the first plurality of features to form the patterned first spacer layer.

20. The method of claim 18, further comprising:

etching back the first material layer to expose the second spacer layer before patterning the first material layer;

transferring the second plurality of features to the substrate; and thereafter removing the patterned first material layer and the first and second spacer layers.

* * * * *